United States Patent
Montena

(10) Patent No.: US 9,516,774 B2
(45) Date of Patent: Dec. 6, 2016

(54) OUTER SLEEVE FOR CATV FILTER

(71) Applicant: PPC Broadband, Inc., East Syracuse, NY (US)

(72) Inventor: Noah Montena, Syracuse, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 177 days.

(21) Appl. No.: 14/013,797

(22) Filed: Aug. 29, 2013

(65) Prior Publication Data

US 2014/0076598 A1  Mar. 20, 2014

Related U.S. Application Data

(63) Continuation of application No. 11/467,247, filed on Aug. 25, 2006, now Pat. No. 8,545,235.

(51) Int. Cl.
| | |
|---|---|
| *H01R 13/62* | (2006.01) |
| *H05K 5/04* | (2006.01) |
| *H01R 24/42* | (2011.01) |
| *H01R 103/00* | (2006.01) |
| *H04N 7/10* | (2006.01) |

(52) U.S. Cl.
CPC ............ *H05K 5/04* (2013.01); *H01R 24/42* (2013.01); *H01R 2103/00* (2013.01); *H04N 7/102* (2013.01)

(58) Field of Classification Search
CPC .............................. H01R 13/6397; H01R 4/30
USPC ......................................... 439/306, 133, 359
See application file for complete search history.

(56) References Cited

U.S. PATENT DOCUMENTS

| | | |
|---|---|---|
| 2,777,998 A | 1/1957 | Shepard |
| 4,701,726 A | 10/1987 | Holdsworth |
| 4,773,880 A | 9/1988 | Sutton et al. |
| 5,150,087 A | 9/1992 | Yoshie et al. |
| 5,432,488 A | 7/1995 | Kotani et al. |
| 5,662,494 A | 9/1997 | Zennamo, Jr. et al. |
| 6,273,766 B1 | 8/2001 | Zennamo, Jr. et al. |
| 6,636,129 B2 | 10/2003 | Zennamo, Jr. et al. |
| 6,683,773 B2 | 1/2004 | Montena |
| 6,737,925 B1 | 5/2004 | Logue et al. |
| 6,737,935 B1 | 5/2004 | Shafer |
| 6,784,760 B2 | 8/2004 | Olcen et al. |
| 6,794,957 B2 | 9/2004 | Shafer et al. |
| 6,829,813 B2 * | 12/2004 | Zennamo et al. ........... 29/592.1 |
| 6,888,423 B2 | 5/2005 | Tresness et al. |
| 6,986,666 B2 | 1/2006 | Benson et al. |
| 7,023,298 B1 | 4/2006 | Palinkas et al. |
| 7,303,439 B1 * | 12/2007 | Montena ................. 439/620.03 |
| 8,545,235 B2 * | 10/2013 | Montena ........................ 439/63 |
| 2002/0064014 A1 | 5/2002 | Montena |
| 2004/0057186 A1 | 3/2004 | Chawgo |
| 2004/0085156 A1 | 5/2004 | Olcen et al. |
| 2004/0104786 A1 | 6/2004 | Shafer et al. |

(Continued)

FOREIGN PATENT DOCUMENTS

| | | |
|---|---|---|
| WO | WO/2004/045072 A1 | 5/2004 |
| WO | WO/2005/029665 A2 | 3/2005 |

(Continued)

*Primary Examiner* — Phuong Dinh
(74) *Attorney, Agent, or Firm* — MH2 Technology Law Group, LLP

(57) ABSTRACT

An outer sleeve for a CATV filter has, in one embodiment, a first end and a second end. The second end has a face with one or more engagement holes.

31 Claims, 3 Drawing Sheets

(56) References Cited

U.S. PATENT DOCUMENTS

2005/0086701 A1    4/2005   Palinkas et al.
2005/0164525 A1    7/2005   Benson et al.
2005/0282433 A1   12/2005   Pixley et al.

FOREIGN PATENT DOCUMENTS

WO    WO/2005/041553 A2    5/2005
WO    WO/2005/041553 A3    5/2005

\* cited by examiner

OUTER SLEEVE FOR CATV FILTER

PRIORITY CLAIM

This application is a continuation of, and claims the benefit and priority of, U.S. patent application Ser. No. 11/467,247, filed on Aug. 25, 2006. The entire contents of such application are hereby incorporated by reference.

FIELD OF THE INVENTION

This invention relates generally to the field of CATV filters, and more particularly to a torque transmitting outer sleeve for a CATV filter.

BACKGROUND

In typical CATV applications, a filter circuit or network is provided to pass signals having frequencies within one or more specified bandwidths, sometimes with a desired amount of signal attenuation, while blocking signals of other frequencies. It is convenient, but not necessary, to mount the electrical components such as capacitors, inductors, and resistors on one or more printed circuit boards in essentially conventional fashion. The circuit board carrying the filter circuit components is mounted within a suitable protective housing. Physical rigidity is required to maintain stable electrical response. Connection headers at each end provide for connecting the filter to a coaxial cable connector and to an equipment port. The entire assembly is commonly referred to as a filter or trap.

It is customary in the CATV industry for system technicians to use special wrenches for the installation and removal of traps. These special wrenches are of the pin spanner type where the driving pins of the wrench are accepted by two shallow holes bored into the end face of one header, sometimes referred to as engagement holes. This has been effective, but requires a degree of manufacturing difficulty and material usage which increases the cost of the trap housing components.

U.S. Pat. Nos. 5,150,087 (Yoshie et al.); U.S. Pat. No. 5,432,488 (Kotani et al.); U.S. Pat. No. 5,662,494 (Zennamo, Jr. et al.); U.S. Pat. No. 6,273,766 (Zennamo, Jr. et al.); U.S. Pat. No. 6,636,129(Zennamo, Jr. et al.); U.S. Pat. No. 6,829,813 (Zennamo, Jr. et al.); and U.S. Pat. No. 6,888,423 (Tresness et al.) all show traps with the two engagement holes drilled into the end face of one of the headers.

SUMMARY

Briefly stated, a housing for a CATV filter includes an outer sleeve which can be made of stainless steel. A filter assembly and two headers are contained within the outer sleeve. Two engagement holes for a special pin spanner-type wrench are formed in a face of the outer sleeve instead of in a header. The engagement holes are preferably "drifted" holes, which in effect means that rims are created during the forming of holes which add to the strength of the holes.

According to an embodiment, an outer sleeve for a CATV filter has a first and second end. The second end includes a face that defines a connector hole. The connector hole is configured to receive a cable connector and the connector hole is located on a first axis. The face also defines at least one engagement hole located on a different axis.

According to another embodiment, a method for making an outer sleeve for a CATV filter includes forming a first hole located on a first axis in a face. The face is located on an end of the outer sleeve and the first hole is configured to receive a cable connector. The method also includes forming at least one engagement hole in the face. The at least one engagement hole located on a different axis.

DETAILED DESCRIPTION OF THE PREFERRED EMBODIMENT

Figure 1:
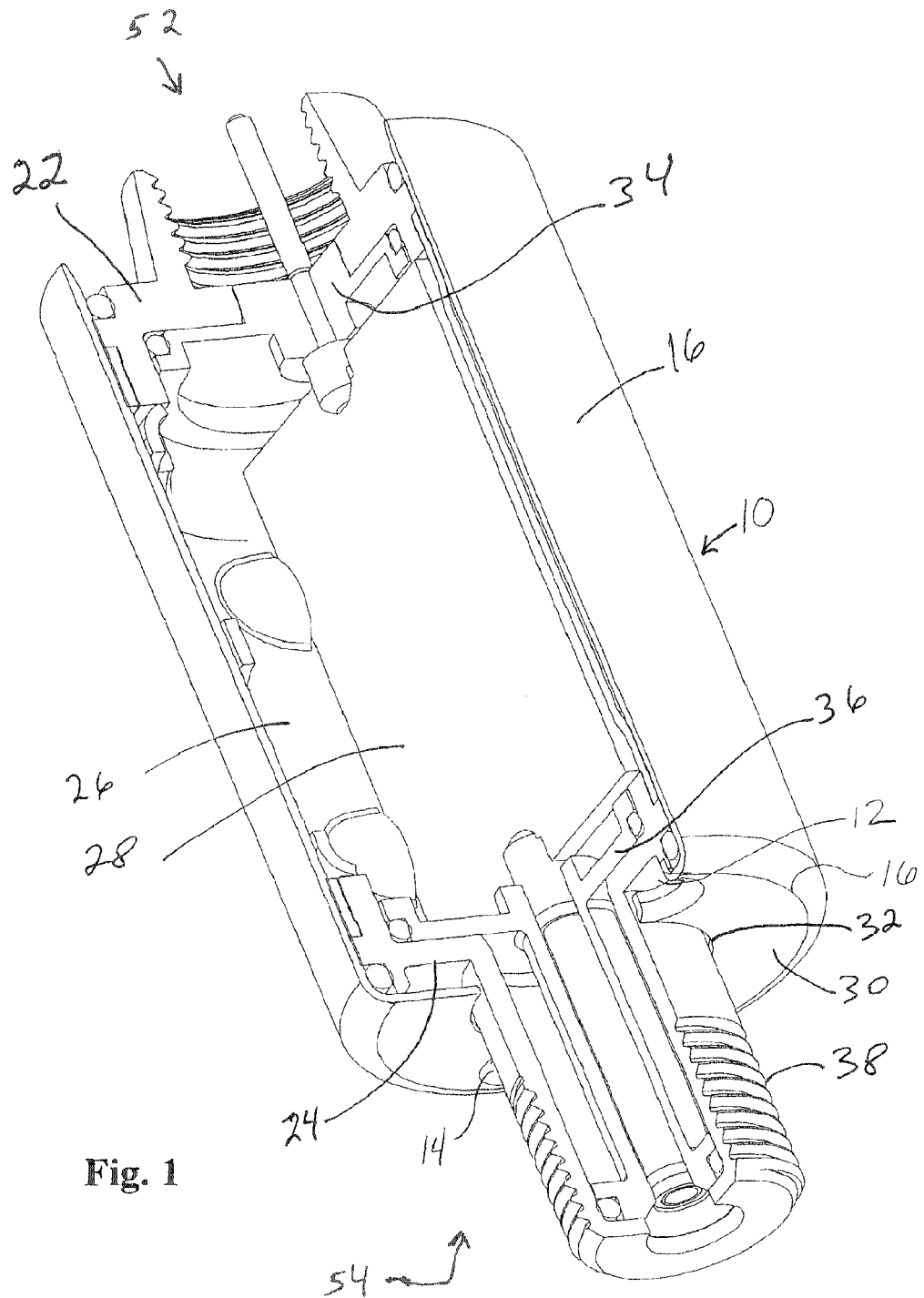
FIG. 1 shows a cutaway perspective view of a filter with a housing according to an embodiment of the present invention.
Figure 2:
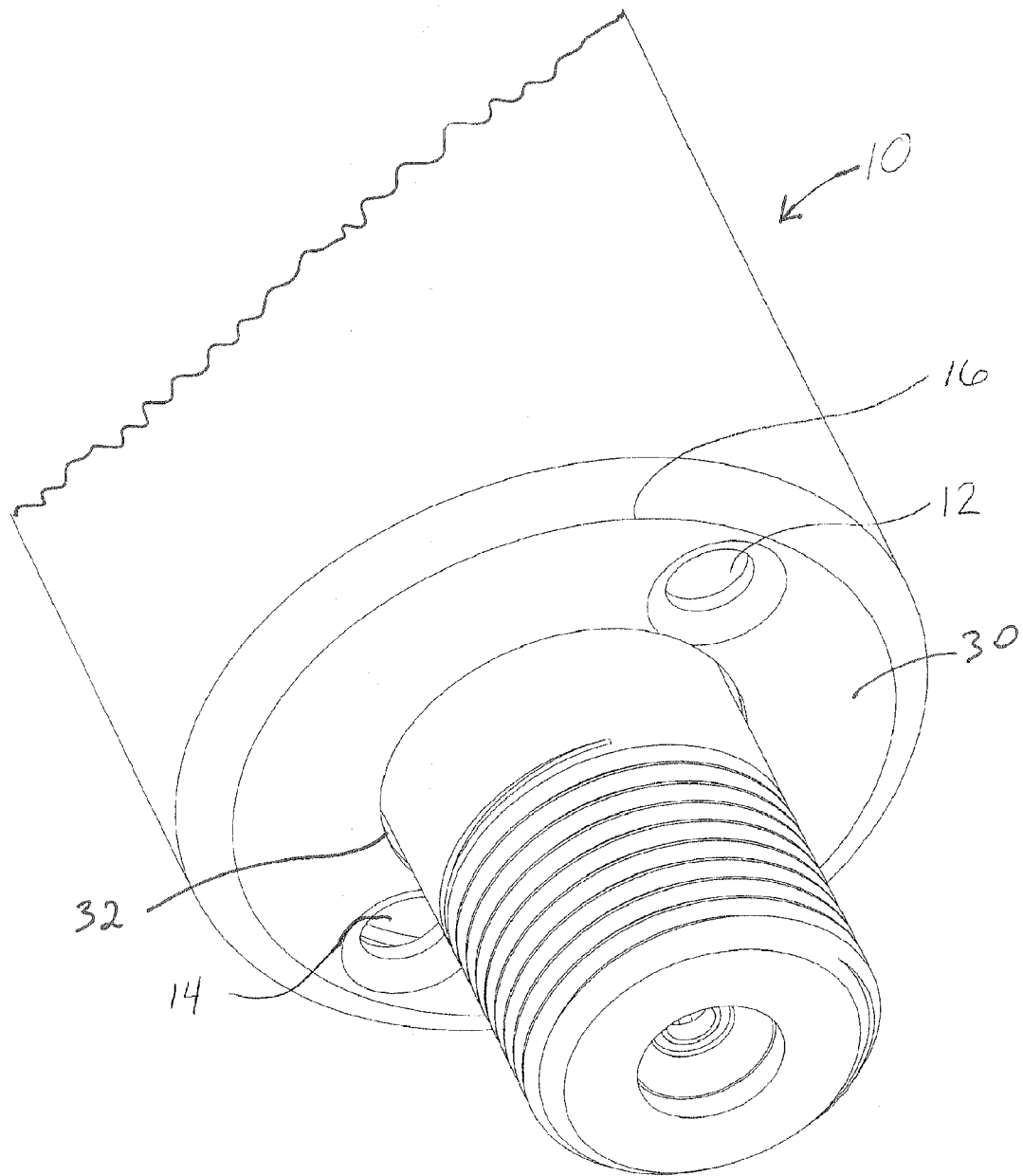
FIG. 2 shows a perspective view of the housing of the embodiment of FIG. 1 with two engagement holes shown.
Figure 3:
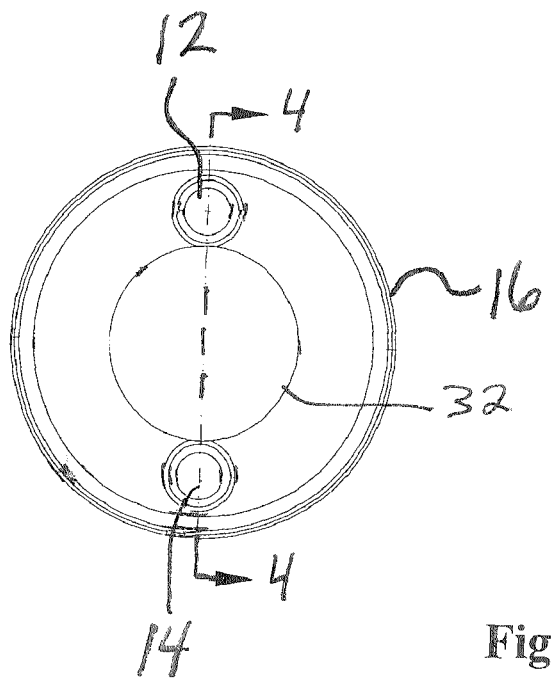
FIG. 3 shows a front elevation view of the embodiment of FIG. 1.
Figure 4:
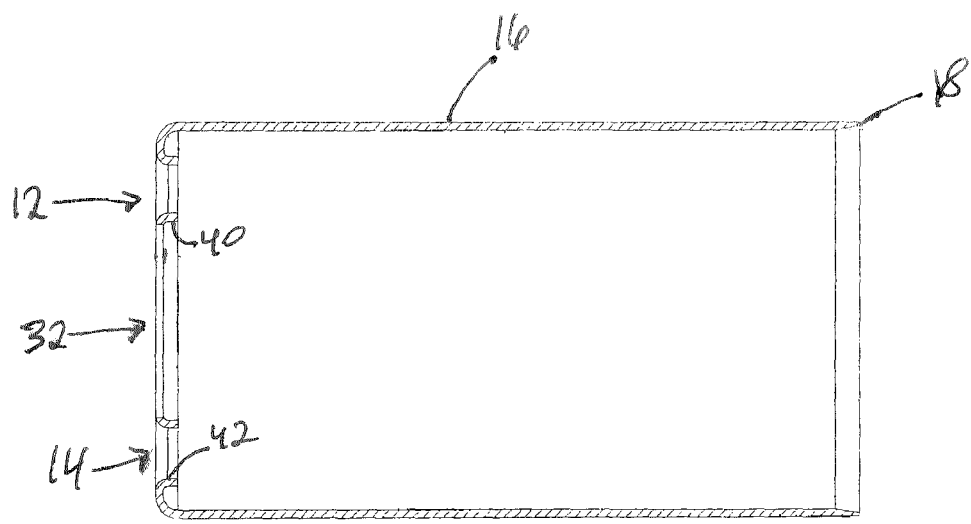
FIG. 4 shows a cross-sectional view taken across line 4-4 of FIG. 3.

Referring to FIGS. 1-4, a CATV filter 10 includes a circuit board 28 connected to an inner frame 26. At one end of filter 10, an insulator 34 is adjacent to one end of circuit board 28 and is held in place partly by a header 22, while at another end of filter 10, an insulator 36 is adjacent to another end of circuit board 28 and is held in place partly by a header 24. An outer sleeve, also known as a housing, 16 fits over inner frame 26 and headers 22, 24 holding the assembly together. A portion of header 22 is shaped to connect to an equipment port (not shown), while a portion of header 24 is shaped to connect to a coaxial cable (not shown) via a coaxial cable connector (not shown), and in particular, includes a threaded connector 38.

Outer sleeve 16 includes a central hole 32 in a face 30 to accommodate threaded connector 38. Outer sleeve 16 also includes two engagement holes 12, 14 to accommodate the driving pins (not shown) of the special pin spanner-type wrench (not shown) which is used in the industry to screw filters and traps onto equipment ports. Outer sleeve 16 is preferably of stainless steel, which is comparable to brass in terms of durability. When fabricating outer sleeve 16 of stainless steel, the part is deep drawn, which means that it starts out as steel sheet and is successively stamped into ever deeper and narrower "soup cans" until the final diameter and length are reached. The bottom end is closed, while the top end is still attached all the way around the rim to the parent sheet.

Engagement holes 12, 14 are then formed in face 30 by punching two small holes in the bottom of the partially formed outer sleeve, after which a larger diameter tapered pin is forced through the holes, pushing the edge inward and stretching the diameter of each engagement hole 12, 14 to its final diameter. Central hole 32 is then punched out, after which the part is sheared off the parent sheet and the edge is compacted in an operation known as a "pinch trim" which tapers edge 18 while eliminating the sharp edge left from the shearing. The taper of edge 18 is preferably approximately 15 degrees to aid in fitting outer sleeve 16 over inner frame 26 and headers 22, 24.

Engagement holes 12, 14 are "drifted" holes, meaning that they have curled-in edges 40, 42, respectively, as a result of how they were made. Simply die-punching engagement holes 12, 14 would not add curled edges 40, 42 to engagement holes 12, 14. The strength of the "drifted" edge of the holes, combined with the durability of the stainless steel base metal, makes engagement holes 12, 14 comparable in performance to drilled holes in brass. Curled edges 40, 42 add effective thickness to engagement holes 12, 14 which is greater than the thickness of the sheet metal itself, thus providing structural rigidity to withstand the up to 90 in-lb of torque expected when abused, with minimal deformation of engagement holes 12, 14. Non-drifted holes actually tear under those conditions, whereas the drifted holes merely become slightly egg-shaped. In addition, the prior art method of drilling engagement holes in one header is costlier than the present method of forming engagement holes 12, 14 in outer sleeve 16.

With no engagement holes in the header, machining or casting or metal injection molding without secondary machining operations becomes possible. The material thickness of the header may also be reduced, also saving costs.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

The following is claimed:

1. An outer sleeve for a CATV filter, the outer sleeve comprising:
   a first end; and
   a second end, the second end comprising a substantially flat face, the face having a flat portion defining a connector hole therein that is configured to receive a cable connector, the connector hole being located on an axis, the face further defining at least one engagement hole in the flat portion, the at least one engagement hole located on a different axis.

2. The outer sleeve of claim 1, wherein the outer sleeve comprises a cylindrical surface and a sloped section, the sloped section being located between the face and the cylindrical surface.

3. The outer sleeve of claim 1, wherein the at least one engagement hole comprises a drifted configuration.

4. The outer sleeve of claim 1, wherein the face defines a plurality of engagement holes located on a plurality of axes other than the axis of the connector hole, wherein the plurality of engagement holes comprises the at least one engagement hole, and wherein the plurality of axes comprises the different axis.

5. The outer sleeve of claim 4, wherein the plurality of engagement holes comprises two engagement holes located opposite of each other, the central axis being located between the two engagement holes.

6. The outer sleeve of claim 1, where the axis of the connector hole is a central axis.

7. The outer sleeve of claim 1, where the first end comprises a first hole, where the first hole is equal in size to an inner diameter of the outer sleeve.

8. An outer sleeve for a CAN filter, the outer sleeve comprising:
   a first end, the first end comprising a first hole, where the first hole is substantially equal in size to an inner diameter of the outer sleeve; a second end, the second end comprising a substantially flat face, the face having a flat portion defining a connector hole therein that is configured to receive a cable connector, the connector hole being located on a central axis, the face further defining two drifted engagement holes, wherein the two drifted engagement holes are defined in the flat portion and are being located opposite of each other; and
   a cylindrical surface, the cylindrical surface being located between the first end and the second end.

9. The outer sleeve of claim 8, wherein the outer sleeve comprises a sloped section, the sloped section being located between the face and the cylindrical surface.

10. The outer sleeve of claim 8, where an edge of the first end of the outer sleeve is tapered.

11. A method for producing an outer sleeve for a CATV filter, the method comprising:
    forming a connector hole located on an axis, the axis extending into a flat portion of a substantially flat face of the outer sleeve, wherein the face is located on an end of the outer sleeve, and wherein the connector hole is configured to receive a cable connector; and
    forming at least one engagement hole in the flat portion of the substantially flat face, the at least one engagement hole located on a different axis.

12. The method of claim 11, wherein the at least one engagement hole is drifted.

13. The method of claim 11, wherein the at least one engagement hole comprises a plurality of engagement holes.

14. The method of claim 11, where the axis of the connector hole is a central axis.

15. The method of claim 11, further comprising deep drawing a steel sheet to form the outer sleeve.

16. The method of claim 15, where deep drawing the steel sheet comprises successively stamping the steel sheet.

17. The method of claim 16, further comprising shearing the outer sleeve from the steel sheet.

18. The method of claim 11, where forming the at least one engagement hole in the face comprises punching out the at least one engagement hole from the face.

19. The method of claim 18, where forming the at least one engagement hole in the face further comprises forcing a tapered pin through the at least one engagement hole, where the tapered pin comprises a larger diameter than the diameter of the at least one engagement hole.

20. The method of claim 11, where forming the connector hole comprises punching out the connector hole from the face.

21. The method of claim 11, further comprising compacting an edge of a second end of the outer sleeve using a pinch trim operation.

22. The method of claim 21, where compacting the second end tapers the edge.

23. The method of claim 22, where the edge comprises a taper of approximately 15 degrees.

24. The outer sleeve of claim 1, wherein the outer sleeve is sized to be received around a header, the header comprising the cable connector that is received through the connector hole of the face of the outer sleeve.

25. A filter, comprising:
    a first header; and
    an outer sleeve positioned at least partially around the first header, the outer sleeve comprising an end having a substantially flat face, wherein the face comprises a flat portion that defines a connector hole therein that is configured to receive a cable connector extending therethrough, and wherein the flat portion defines at least one engagement hole therein.

26. The filter of claim 25, wherein the first header comprises the cable connector that extends through the connector hole.

27. The filter of claim 26, wherein the cable connector is configured to be coupled with a coaxial cable.

28. The filter of claim 25, wherein a portion of the first header is shaped to connect to an equipment port.

29. The filter of claim 25, further comprising:
a second header spaced apart from the first header; and
a circuit board positioned at least partially between the first and second headers, wherein the outer sleeve is positioned at least partially around the second header and the circuit board.

30. The filter of claim 25, wherein the connector hole is located at a central axis of the outer sleeve, and wherein the at least one engagement hole is offset from the central axis.

31. The filter of claim 30, wherein the at least one engagement hole comprises two engagement holes that are separated angularly apart from one another about the central axis.

* * * * *